(12) United States Patent
Bilodeau et al.

(10) Patent No.: US 9,634,444 B2
(45) Date of Patent: Apr. 25, 2017

(54) CABINET BACKPLANE INTERCONNECT

(71) Applicant: COOPER TECHNOLOGIES COMPANY, Houston, TX (US)

(72) Inventors: Hugues Bilodeau, Lévis (CA); Benoit Bouchard, Saint-Jean-Chrysostome (CA); Alain Picotte, Saint-Jean-Chrysostome (CA); Sébastien Gravel, L'ancienne-Lorette (CA)

(73) Assignee: COOPER TECHNOLOGIES COMPANY, Houston, TX (US)

( * ) Notice: Subject to any disclaimer, the term of this patent is extended or adjusted under 35 U.S.C. 154(b) by 0 days.

(21) Appl. No.: 14/964,732

(22) Filed: Dec. 10, 2015

(65) Prior Publication Data

US 2016/0172806 A1    Jun. 16, 2016

Related U.S. Application Data

(60) Provisional application No. 62/090,413, filed on Dec. 11, 2014.

(51) Int. Cl.
*H01R 25/00* (2006.01)
*H01R 27/02* (2006.01)
(Continued)

(52) U.S. Cl.
CPC ....... *H01R 25/006* (2013.01); *H01R 12/7005* (2013.01); *H01R 31/06* (2013.01); *H01R 43/205* (2013.01); *H05K 7/1457* (2013.01)

(58) Field of Classification Search
CPC ........ H01R 25/00; H01R 27/02; H01R 31/00; H01R 31/005; H01R 31/02; H01R 31/06;
(Continued)

(56) References Cited

U.S. PATENT DOCUMENTS 5,973,947 A    10/1999  Shih
6,038,126 A     3/2000  Weng
(Continued)

OTHER PUBLICATIONS

European Patent Office, "International Search Report and Written Opinion" (Corresponding PCT/US2015/064899), Apr. 15, 2016, 12 pp.

*Primary Examiner* — Chandrika Prasad
(74) *Attorney, Agent, or Firm* — Eckert Seamans; Stephen Bucchianeri; Philip Levy

(57) ABSTRACT

An interconnect for an installation environment adapted for housing at least one electrical component having a number of first connectors each having a first configuration, wherein the installation environment has pre-installed wiring having a number of second connectors each having a second configuration. The interconnect includes a backplane component including a number of third connectors adapted to connect with the number of first connectors, and a number of fourth connectors adapted to connect with the number of second connectors, wherein each of the number of fourth connectors is coupled to a respective one of the number of third connectors in a manner that maps the second configuration to the first configuration, and includes a mechanical bracket component adapted to allow for the installation of at least one electrical component such that the first connectors are connected to the third connectors.

10 Claims, 8 Drawing Sheets

(51) Int. Cl.
*H01R 31/00* (2006.01)
*H01R 33/00* (2006.01)
*H01R 31/06* (2006.01)
*H05K 7/14* (2006.01)
*H01R 12/70* (2011.01)
*H01R 43/20* (2006.01)

(58) Field of Classification Search
CPC ........ H01R 27/00; H01R 33/00; H01R 12/70; H01R 43/20; H01R 25/006; H01R 12/7005; H01R 43/205; H01R 24/54; H01R 33/88; H01R 33/94; H01R 12/716; H01R 13/645
USPC .................................. 439/300, 61, 638–640
See application file for complete search history.

(56) References Cited

U.S. PATENT DOCUMENTS

| | | | |
|---|---|---|---|
| 6,163,464 A * | 12/2000 | Ishibashi | G06F 1/184 174/261 |
| 6,347,963 B1 | 2/2002 | Falkenberg et al. | |
| 2002/0109971 A1 * | 8/2002 | Gilley | H05K 7/1448 361/724 |
| 2004/0029458 A1 | 2/2004 | Wu | |
| 2006/0061977 A1 | 3/2006 | Brolin et al. | |
| 2011/0122549 A1 | 5/2011 | Coffey et al. | |
| 2014/0213101 A1 * | 7/2014 | Gomez | H01R 27/02 439/505 |
| 2014/0268599 A1 * | 9/2014 | Laufer | H05K 7/1461 361/752 |
| 2015/0146353 A1 * | 5/2015 | MacNeil | G06F 1/187 361/679.02 |
| 2015/0296652 A1 * | 10/2015 | Rossman | H04Q 1/06 361/826 |
| 2016/0056554 A1 * | 2/2016 | Costello | H01R 12/7076 439/65 |
| 2016/0172806 A1 * | 6/2016 | Bilodeau | H01R 12/7005 439/76.1 |
| 2016/0181719 A1 * | 6/2016 | Tamarkin | H01R 13/502 439/638 |

* cited by examiner

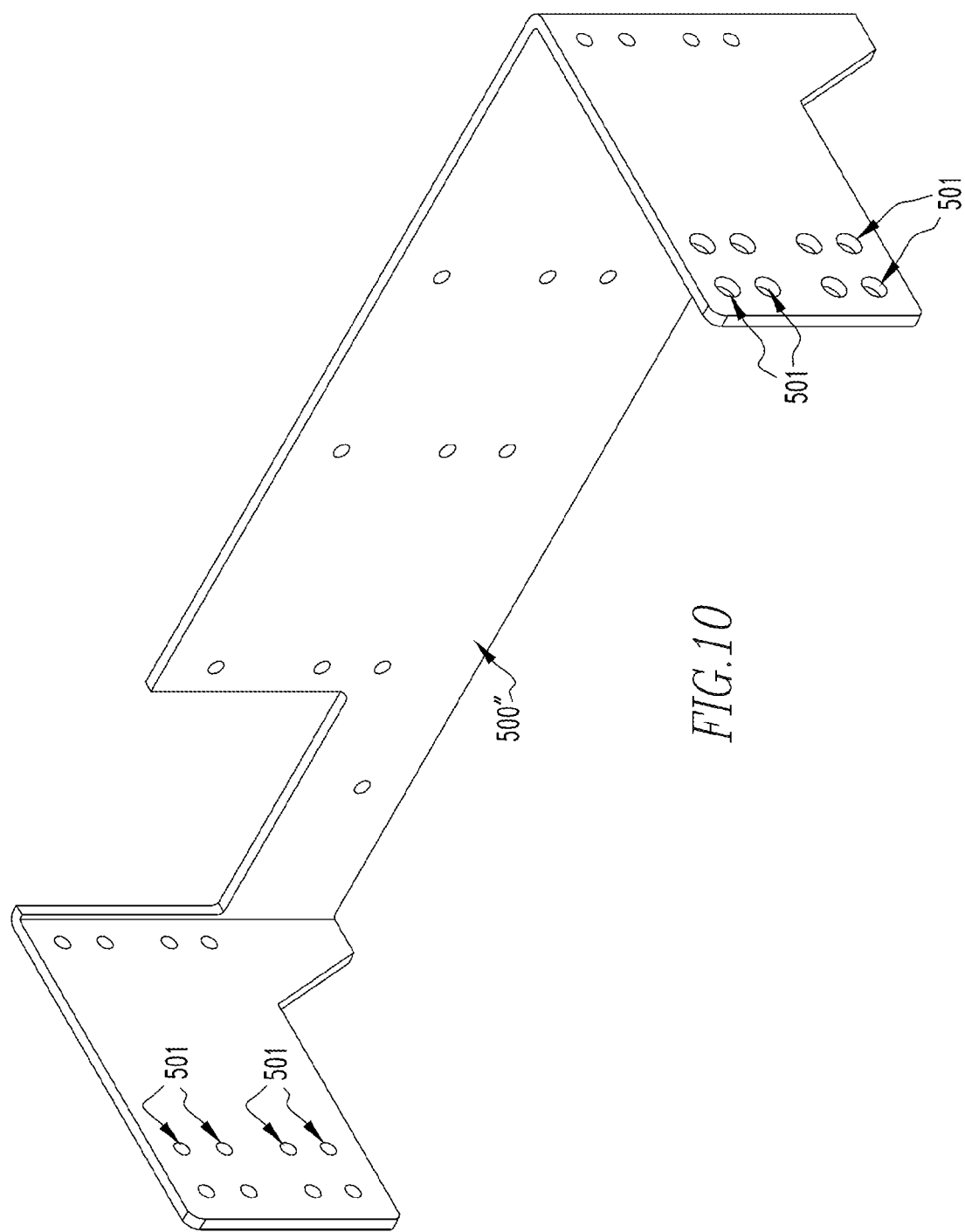

CABINET BACKPLANE INTERCONNECT

CROSS-REFERENCE TO RELATED APPLICATIONS

This application claims priority under 35 U.S.C. §119(e) from U.S. provisional patent application no. 62/090,413, entitled "Cabinet Backplane Interconnect" and filed on Dec. 11, 2014, the contents of which are incorporated herein by reference.

BACKGROUND

Field

This disclosure relates generally to components coupled to the power distribution grid, and more specifically to systems and methods for replacing obsolete components coupled to the power distribution grid.

Background Information

In electric power systems substations, cabinets are used to house equipment of various types. These cabinets may be installed outdoors, in which case they are designed to protect the equipment from the elements (rain, cold, heat, etc.). A lockable front door is used to access the equipment for maintenance and to protect it from unauthorized access.

Depending on the size and the specific communication requirements of the substation, the type of equipment inside the cabinet may vary, but will often be a combination of an Intelligent Electronic Devices (IEDs), Remote Terminal Units (RTU) and other I/O devices, connectors, cables, modems, radios, batteries and power supplies. As a whole, the equipment plays a critical role in an electric power system since they collect data from the substation (e.g. voltage, current, alarm indications) and perform remote control operations (e.g. open a breaker).

Space is often very limited in these cabinets. Hence, the equipment is usually installed very closely together and the wiring between devices is customized to fit perfectly. Replacing faulty equipment often requires using the exact same make and model to avoid any rewiring or worse, redesigning the entire layout of the equipment. For cases in which a new model of a component is desired, often a complete or near-complete rewiring of the devices in the cabinet is required. Such rewiring is expensive, time consuming, and prone to errors.

A more efficient and cost-effective way to replace components stored inside cabinets is desired.

SUMMARY

Objects and advantages of the present disclosure will be set forth in the following description, or may be obvious from the description, or may be learned through practice of the present disclosure.

In one embodiment, a cabinet backplane interconnect for an installation environment adapted for housing at least one electrical component is provided. The at least one electrical component has a number of first connectors each having a first configuration, and the installation environment has pre-installed wiring having a number of second connectors each having a second configuration. The interconnect includes a backplane component including a number of third connectors adapted to connect with the number of first connectors of the at least one electrical component, and a number of fourth connectors adapted to connect with the number of second connectors of the pre-installed wiring, wherein each of the number of fourth connectors is coupled to a respective one of the number of third connectors in a manner that maps the second configuration to the first configuration. The interconnect also includes a mechanical bracket component adapted to allow for the installation of at least one electrical component in a manner wherein each of the number of first connectors is connected to a respective one of the number of third connectors.

In another embodiment, a method of replacing a legacy electrical component with a new electrical component in an installation environment is provided, the new electrical component having a number of first connectors each having a first configuration, and the installation environment having pre-installed wiring having a number of second connectors each having a second configuration. The method includes disconnecting the pre-installed wiring from the legacy electrical component, removing the legacy electrical component from the installation environment, installing a backplane component in the installation environment, the backplane component including a number of third connectors adapted to connect with the number of first connectors of the new electrical component, and a number of fourth connectors adapted to connect with the number of second connectors of the pre-installed wiring, wherein each of the number of fourth connectors is coupled to a respective one of the number of third connectors in a manner that maps the second configuration to the first configuration, installing a mechanical bracket component in the installation environment, installing the new electrical component in the mechanical bracket component such that each of the number of first connectors is connected to a respective one of the number of third connectors, and connecting each of the number of second connectors to a respective one of the number of fourth connectors.

BRIEF DESCRIPTION OF THE DRAWINGS

A full understanding of the disclosed concept can be gained from the following description of the preferred embodiments when read in conjunction with the accompanying drawings in which:

FIG. 10 is an isometric view of one particular embodiment of the mechanical bracket component of the disclosed concept.

DESCRIPTION OF THE PREFERRED EMBODIMENTS

Figure 1:
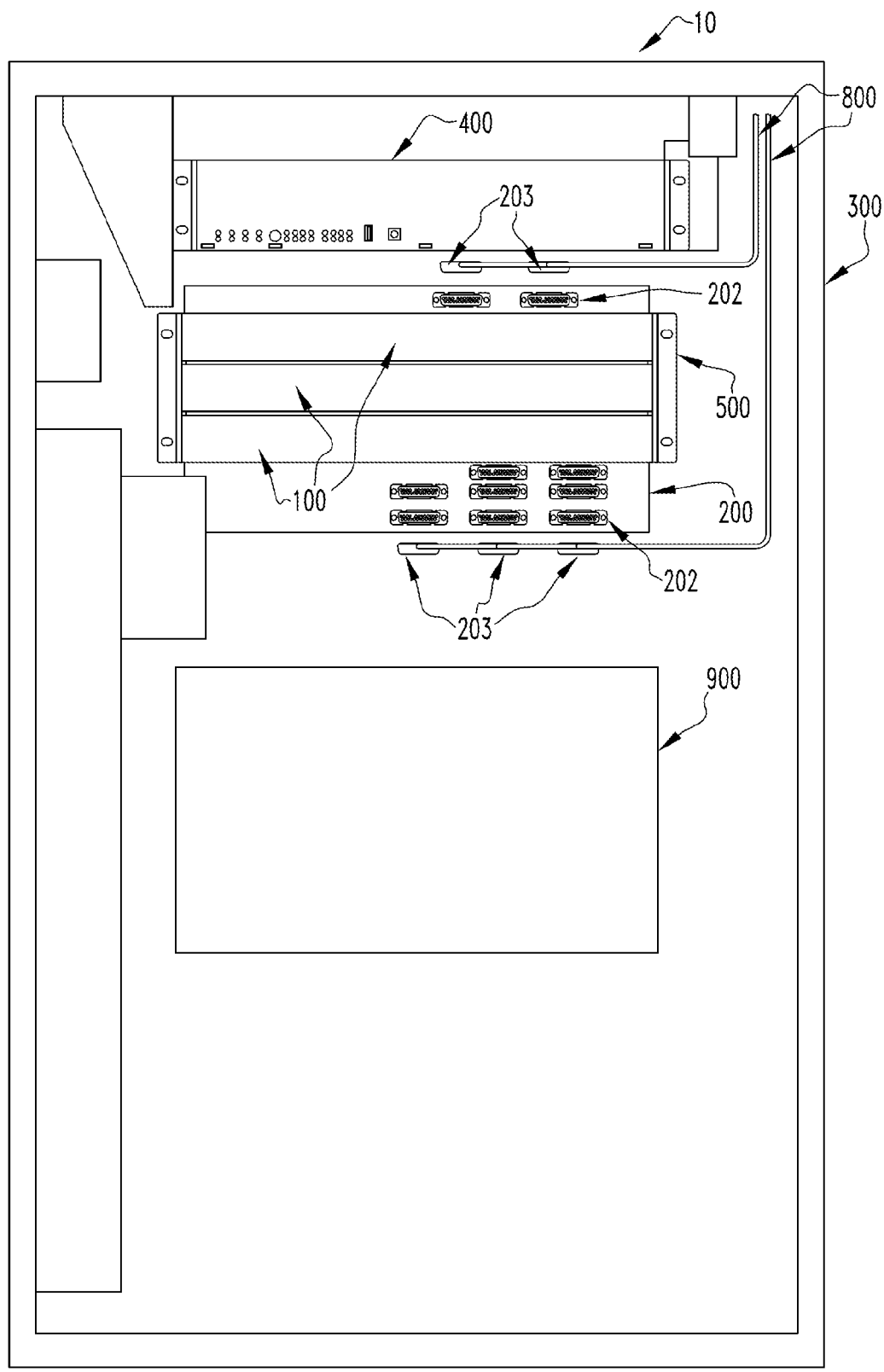
FIG. 1 is a front schematic view of one embodiment of the disclosed concept.

Directional phrases used herein, such as, for example, left, right, front, back, top, bottom and derivatives thereof, relate to the orientation of the elements shown in the drawings and are not limiting upon the claims unless expressly recited therein. As employed herein, the term "number" shall mean one or an integer greater than one (i.e., a plurality).

As employed herein, the statement that two or more parts are "coupled" together shall mean that the parts are joined together either directly or joined through one or more intermediate parts.

Figure 8:
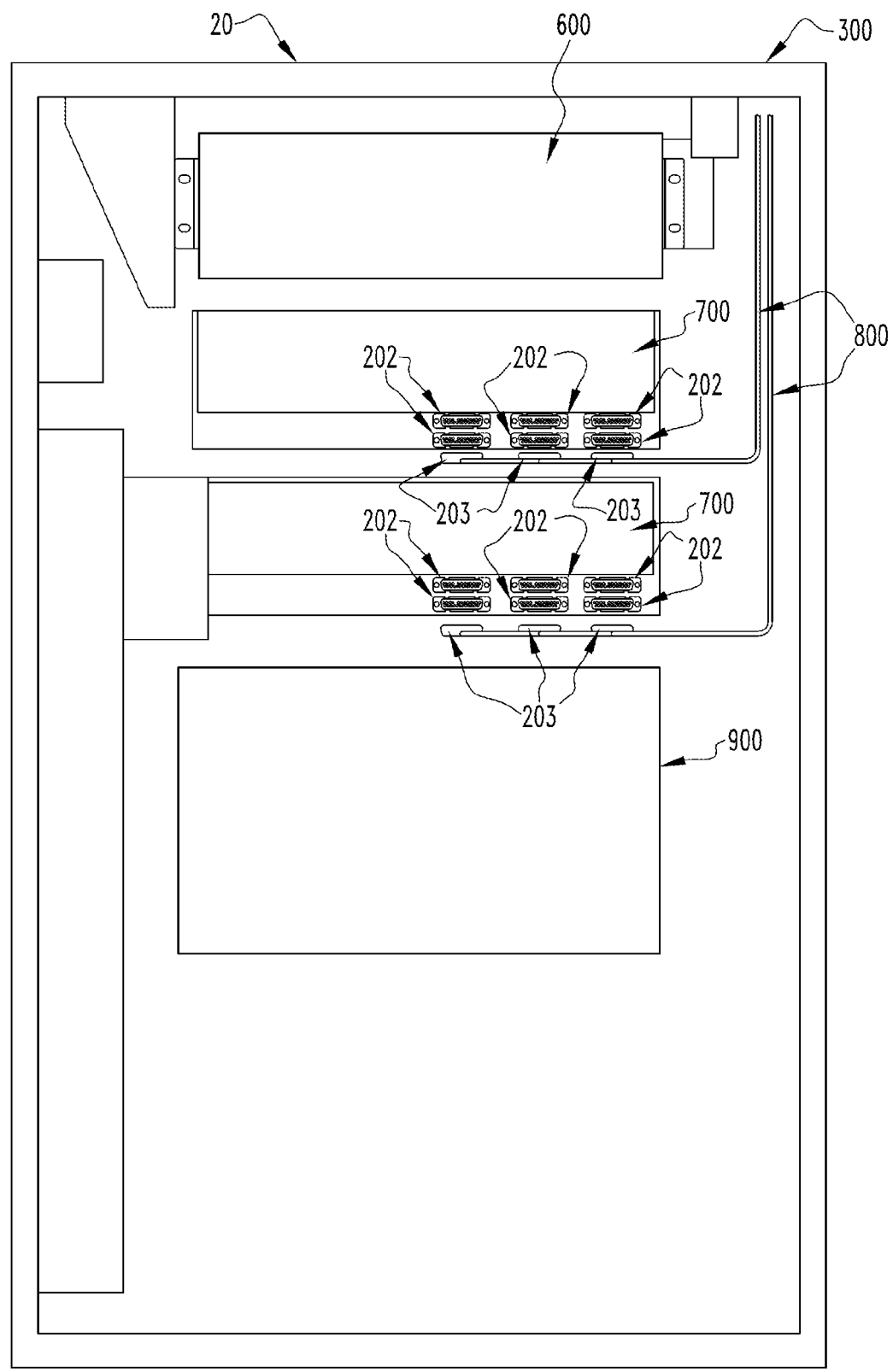
FIG. 8 is a front view of an example of a legacy electrical device configuration.

FIG. 8 is a front schematic view of an exemplary legacy electrical device 20 that may be used in, for example, and without limitation, a substation of an electrical power system for housing various type of electrical equipment. In the illustrated embodiment, legacy electrical device 20 comprises a variety of electrical components located within an enclosure comprising a cabinet 300 (a lockable front door of cabinet 300 is not shown for ease of illustration). The electrical components located within legacy electrical device 20 may include, for example, a legacy master control unit 600 that operates as the main control for legacy electrical device 20. Legacy electrical device 20 may also include, for example, a number of legacy input-output (I/O) components 700 that allow legacy electrical device 20 to send control information to, and receive information from, locations remote from legacy electrical device 20. Such transfer of information may be done directly from legacy I/O components 700, or indirectly through other components located within or outside cabinet 300. Legacy electrical device 20 may also include wiring in the form of cabling 800 having connectors 203 structured to connect to legacy connectors 202 of legacy I/O components 700 or other components within cabinet 300. Although legacy I/O components 700 are described herein as an exemplary electrical component that may be housed within cabinet 300, it will understood that that is not meant to be limiting, and that various other types of electronic components, such as RTUs, or a combination of different types of components, may be used instead of or in addition to one or more of legacy I/O components 700. Finally, the electrical components located within legacy electrical device 20 may include a legacy relay module 900.

Over time, the electrical components housed within legacy electrical device 20 may become obsolete for any of a number of reasons, such as reliability concerns due to the age of the components, performance issues with older components, security concerns, or improved features in newer generations of components. However, for cost reasons or other concerns, the owner of legacy electrical device 20 may desire to only replace certain components within cabinet 300 while leaving the remainder of the components and cabling 800 intact.

FIG. 1 a front schematic view of an exemplary electrical device 10 according to an exemplary embodiment of the disclosed concept. Electrical device 10 includes a number of the same parts and/or components as legacy electrical device 20, and like parts and/or components are labelled with like reference numerals. However, as described in detail herein, in electrical device 10, certain components of legacy electrical device 20 have been replaced with new components.

In particular, as seen in FIG. 1, in this embodiment, legacy electrical device 20 has been retrofit to form electrical device 10 in a manner wherein legacy master control unit 600 has been replaced by a new master control unit 400, and legacy I/O components 700 have been replaced by new I/O components 100. In addition, a mechanical bracket component 500 has been added to electrical device 10 to facilitate the installation of new I/O components 100. In the illustrated embodiment, up to three new I/O components 100 (or other components, such as RTUs) may be installed by sliding them into mechanical bracket component 500. It will be understood that the illustrated embodiment allowing up to three new I/O components 100 is meant to be exemplary only, and that the disclosed concept may include the capability to add a greater or lesser number of new I/O components 100 or other electrical components.

Figure 3:
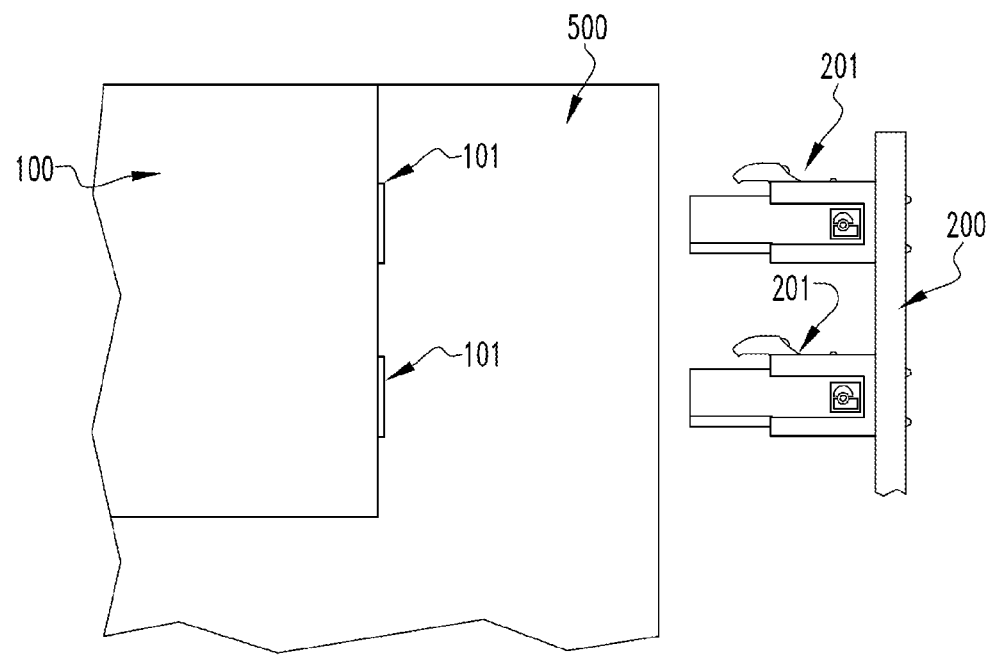
FIG. 3 is a partial side view of the backplane component of one embodiment of the disclosed concept in relation to one of the I/O devices.
Figure 4:
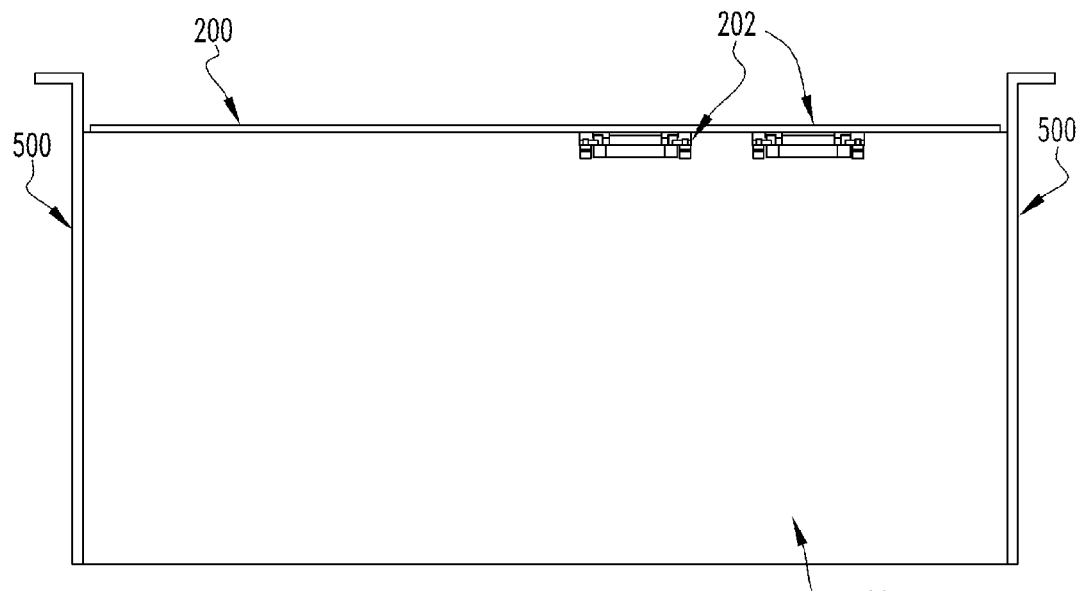
FIG. 4 is a top view of an I/O device connected to the backplane component of one embodiment of the disclosed concept.

Furthermore, in this embodiment, a backplane component 200 has also been added to electrical device 10. As described in detail herein, backplane component 200 is structured to allow existing cabling 800 from legacy electrical device 20 to substantially remain in place in electrical device 10 so that it may be reused with new master control unit 400 and I/O components 100. One potential issue with replacing the components within legacy electrical device 20 during a retrofit as described herein is that the existing pin configuration of connectors 203 at the termination of cabling 800 that were used to connect to legacy I/O components 700 is unlikely to be compatible with the pin configuration necessary to connect to new I/O components 100 which have connectors 101 (FIGS. 3 and 4 described below). In these instances, in one or more exemplary embodiments, backplane component 200 is used to map the pin configuration of the connector 203 of the legacy or existing cabling 800 to a pin configuration suitable for connectors 101 of new I/O components 100. This may be achieved by using a printed circuit board (PCB) 204 (shown schematically in FIG. 7 described below) as a portion of backplane component 200 to map legacy connectors 202 provided on backplane component 200 that are suitable for connection to the connector 203 of existing cabling 800 to connectors 201 also provided on backplane component 200 that are suitable for connecting to connectors 101 of new I/O components 100, described in more detail below.

Figure 2:
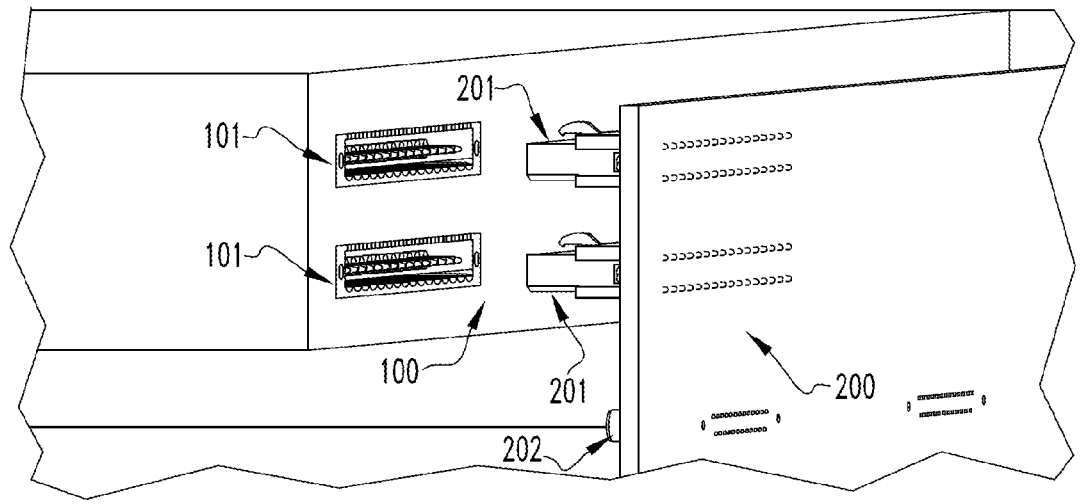
FIG. 2 is a partial isometric view of the backplane component of one embodiment of the disclosed concept in relation to one of the I/O devices.

FIG. 2 is a partial isometric view of backplane component 200 of the exemplary embodiment in relation to one of the new I/O components 100. The connector 203 from existing cabling 800 is mated with legacy connector 202 on the backplane component 200. Using the PCB 204 of backplane component 200, the signals from legacy connector 202 are mapped onto connector 201, where connector 201 is suitable for connection with the I/O components 100 through connectors 101.

In one or more particular exemplary embodiments, printed circuit board 204 includes circuitry adapted to provide one or more particular functions such as, but not limited to, fusing, tension conversion, provision of resistances, transient voltage suppression, RS-232 to RS-485 conversion, signal conditioning, protocol conversion, I/O wetting, and test points.

FIG. 3 is a partial side view of backplane component 200 of the exemplary embodiment in relation to one of the new I/O components 100. As illustrated by FIG. 3, connectors 201 of backplane component 200 are configured to slide into connectors 101 of new I/O components 100.

FIG. 4 is a top view of backplane component 200 of the exemplary embodiment connected to one of the new I/O components 100. Mechanical bracket component 500 may be used to align or guide connectors 101 of the new I/O component 100 onto connectors 201 of backplane component 200.

Figure 5:
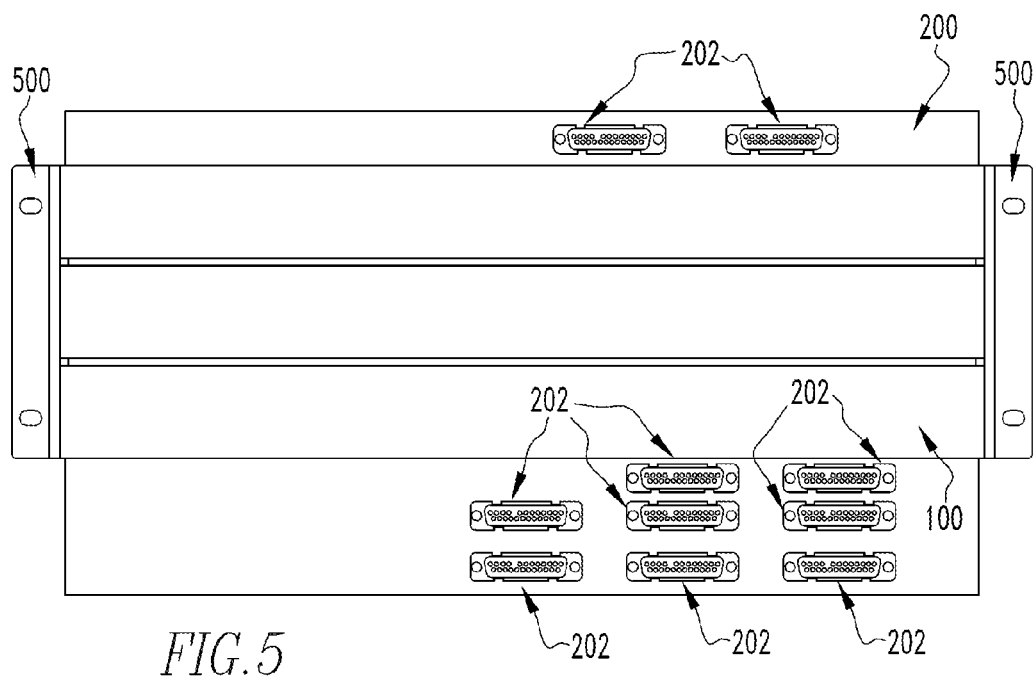
FIG. 5 is a front view of one embodiment of the backplane component of the disclosed concept with three I/O devices connected to the backplane component.
Figure 6:
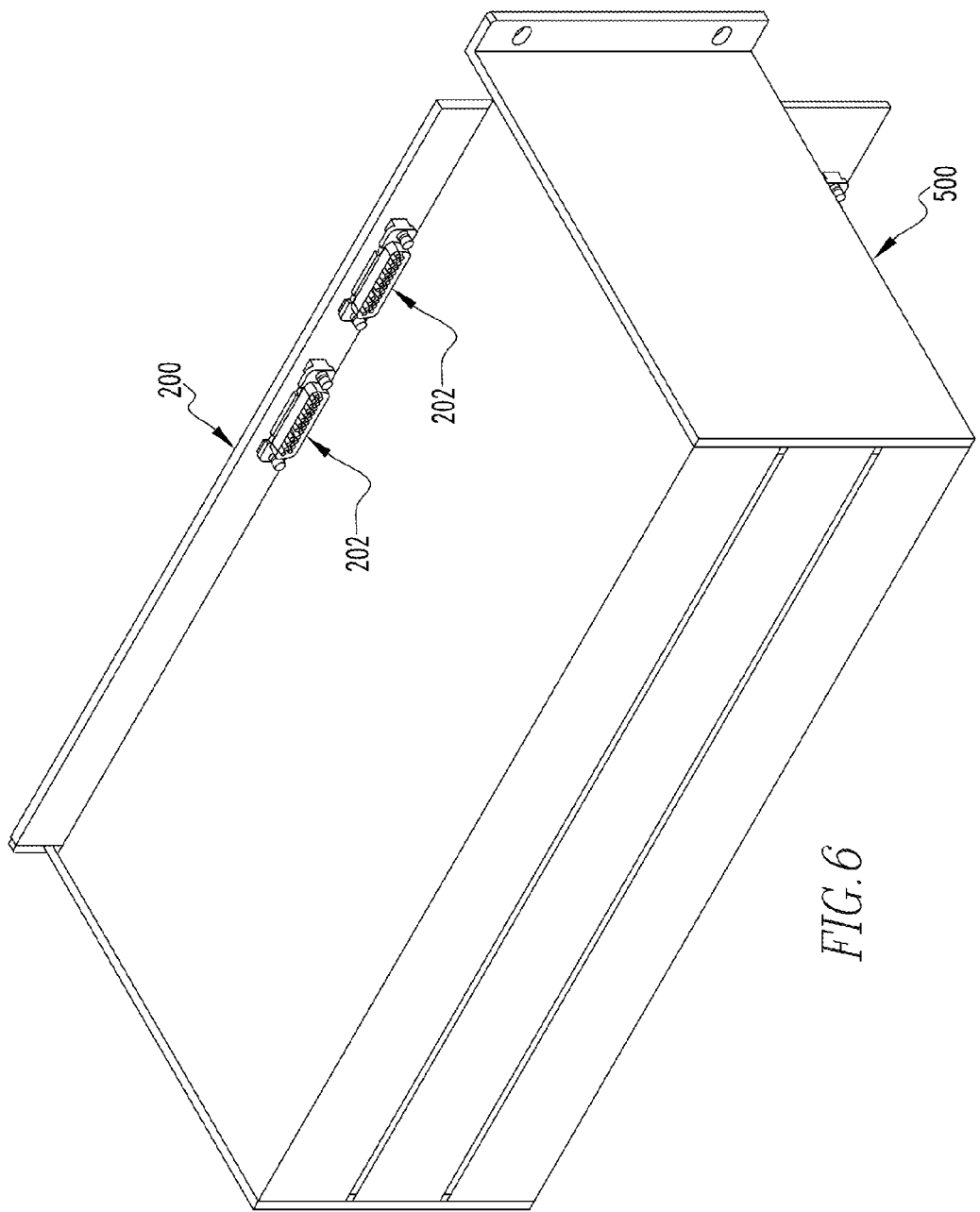
FIG. 6 is an isometric view of one embodiment of the invention with three I/O devices connected to the backplane.

FIG. 5 is a front view and FIG. 6 is an isometric view of backplane component 200 of the exemplary embodiment with three new I/O components 100 connected to it wherein mechanical bracket component 500, in which new I/O components 100 are installed and legacy connectors 202 may be seen.

Figure 7:
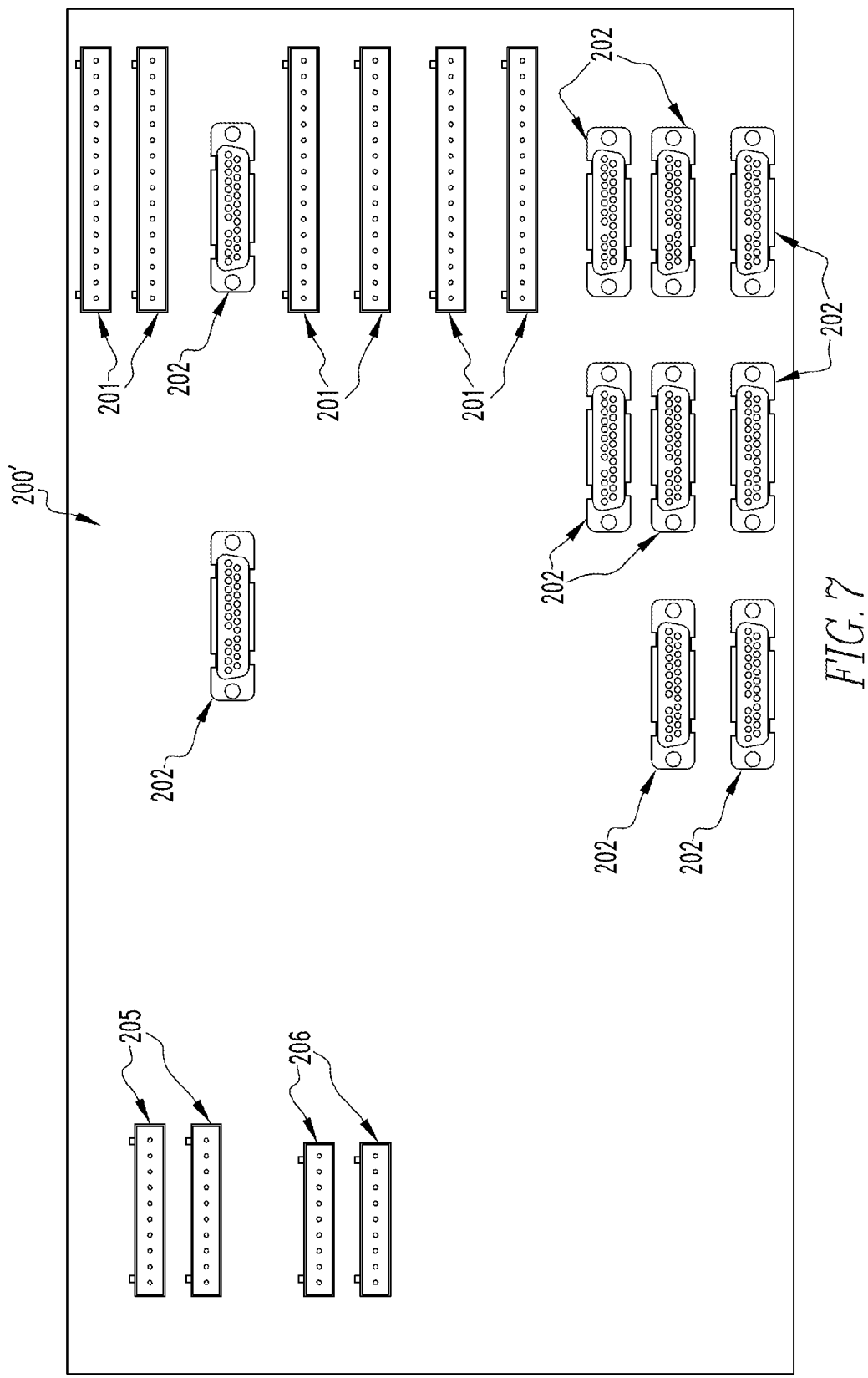
FIG. 7 is a front view of the backplane component of one embodiment of the disclosed concept.

FIG. 7 is a front view of backplane component 200' of an alternative exemplary embodiment which illustrates one possible layout of connectors 201 and connectors 202. As described elsewhere herein, connectors 202 are configured to connect to the various other devices installed in cabinet 300 using existing cabling 800. Backplane component 200 may further comprise additional connectors 205 to allow the new I/O components 100 to communicate with the master control device 400, and power connectors 206 to provide the installed new I/O components 100 with power through backplane component 200. Backplane component 200 is designed such that certain connectors 201 are electrically connected to certain other connectors 202 such that the electrical interface provided by connectors 202 is compatible with the requirements of the other devices installed in cabinet 300 and the electrical interface provided by connectors 201 is compatible with the requirements of the new I/O components 100.

Figure 9:
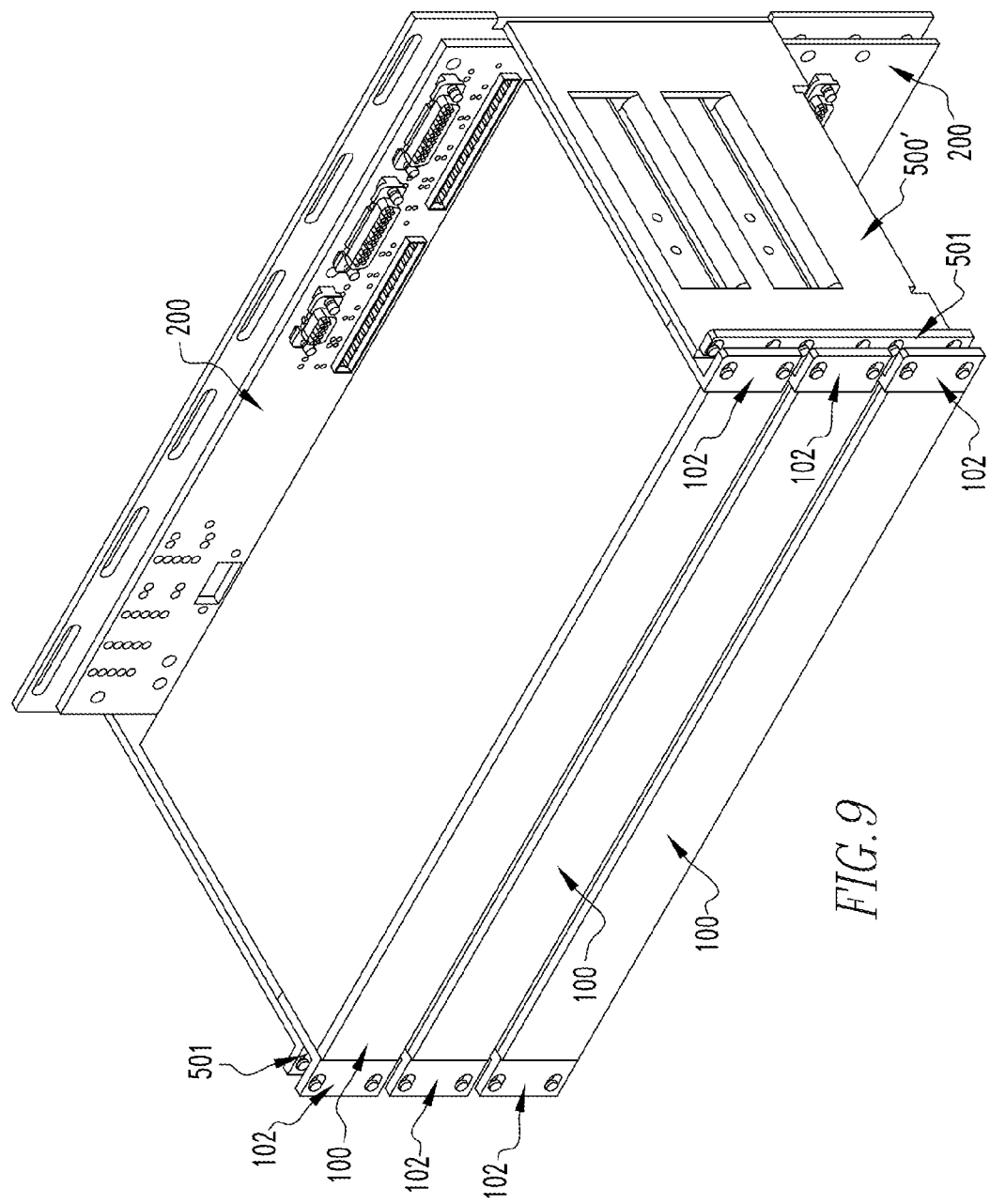
FIG. 9 is an isometric view of one particular embodiment of the disclosed concept.

The mechanical bracket component may further comprise means for affixing the new I/O component 100 to mechanical bracket component such that connectors 101 and connectors 201 are interlocked. More specifically, FIG. 9 is an isometric view of one particular embodiment of the disclosed concept in which an affixing bracket 102 is used to affix the I/O components 100 (or, alternatively, an RTU) to an alternative mechanical bracket component 500'. The holes in the affixing bracket 102 are aligned to holes 501 in the mechanical bracket component 500' (which in this case are threaded) to allow the device to be screwed into place. FIG. 9 further shows an adaptation of the mechanical bracket component 500' which allows the I/O components 100 (or, alternatively, an RTU) to align their connectors 101 with the backplane's connectors 201.

In one exemplary embodiment, the mechanical bracket component 500, 500' and the backplane component 200, 200' is formed as a pre-assembled assembly that is installed as a unit.

FIG. 10 is an isometric view of a further alternative mechanical bracket component 500" of the disclosed concept, in which holes 501' allow the I/O components 100 (or alternatively, an RTU) to be fixed to the mechanical bracket component 500".

Although the foregoing discussion refers generally to new I/O components 100, these components may interchangeably be RTUs. For example, all devices may be new I/O components 100, all devices may be RTUs, or some combination thereof. Additionally, although the foregoing discussion refers to use of existing cabling 800 and the connector associated with that cabling, the invention also contemplates the potential use of additional components, such as an adapter connector that sits between the connector associated with the existing cabling and connector 202 on the backplane component 200. Although certain connectors are illustrated as male connectors and others are illustrated as female connectors, this disclosure contemplates either case to be encompassed by the invention.

Furthermore, although the foregoing discussion refers generally to the disclosed being implemented in a cabinet enclosure 300, this disclosure also contemplates that the disclosed may be implemented with other mounting/housing structures such as, without limitation, a wall-mount or a rack-mount environment.

Embodiments of the invention may also be described as a method of retrofitting a legacy electrical device 20, such as that described in connection with FIG. 8, with newer components (to form electrical device 10), while substantially maintaining existing cabling 800 in cabinet 300. An exemplary method is described below for replacing legacy main control component 600 with a new main control component 400, and at least one legacy I/O component 700 with a new I/O component 100. The technician may disconnect the existing cabling 800 from legacy main control component 600 and legacy I/O component 700, and remove legacy main control component 600 and legacy I/O component 700 from legacy electrical device 20. The technician may next install a backplane component 200 that includes connectors 202 compatible with the connector for existing cabling 800, as well as connectors 201 compatible with new I/O components 100. The technician may next install a mechanical bracket component 500 within cabinet 300, and may use mechanical bracket component 500 to install a new I/O component 100 into the system. Connector 201 of backplane component 200 will mate with connector 101 of new I/O component 100. The technician may also install a new main control component 400 into the system. The technician may connect the existing cabling 800 to connectors 202 on backplane connector 200, and may connect additional connectors on the backplane connector to connectors on new main control component 400. Although the steps are described above in a certain order, one of ordinary skill in the art will recognize that the steps need not necessarily be performed in that order. Not all of the preceding steps need to be performed to fall within the scope of this invention.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. A backplane interconnect for an installation environment adapted for supporting at least one electrical component, the at least one electrical component having a number of first connectors each having a first configuration, the installation environment having pre-installed wiring having a number of second connectors each having a second configuration, the backplane interconnect comprising:
 a backplane component having a front side and a back side disposed opposite the front side, the backplane component including:
  a number of third connectors facing the same direction as the front side, each of the third connectors adapted to connect with the number of first connectors of the at least one electrical component, and
  a number of fourth connectors facing the same direction as the front side, each of the fourth connectors adapted to connect with the number of second connectors of the pre-installed wiring, wherein each of the number of fourth connectors is coupled to a respective one of the number of third connectors in a manner that maps the second configuration to the first configuration; and a mechanical bracket component adapted to allow for the installation of at least one electrical component in a manner wherein each of the number of first connectors is connected to a respective one of the number of third connectors.

2. The backplane interconnect according to claim 1, wherein the backplane component includes a printed circuit board structured to couple each of the number of fourth connectors the respective one of the number of third connectors in a manner that maps the second configuration to the first configuration.

3. The backplane interconnect according to claim 2, wherein the printed circuit board includes circuitry adapted to provide one or more of the following functions: fusing, tension conversion, provision of resistances, transient voltage suppression, RS-232 to RS-485 conversion, signal conditioning, protocol conversion, I/O wetting, and test point provision.

4. The backplane interconnect according to claim 1, wherein the first configuration comprises a first pin configuration and the second configuration comprises a second pin configuration.

5. The backplane interconnect according to claim 1, wherein the at least one electrical component includes an I/O component.

6. The backplane interconnect according to claim 1, wherein the at least one electrical component includes a Remote Terminal Unit.

7. The backplane interconnect according to claim 1, wherein the backplane component further comprises one or more power connectors permitting the furnishing of power to the at least one electrical component through the backplane component.

8. The backplane interconnect according to claim 1, further comprising means for affixing the at least one electrical component to the mechanical bracket component such that the first and third connectors are interlocked.

9. The backplane interconnect according to claim 1, wherein the first, second, third and fourth connectors are communications connectors.

10. The backplane interconnect according to claim 1, wherein the installation environment comprises a cabinet for housing the least one electrical component.

* * * * *